(12) United States Patent
Benabdelaziz et al.

(10) Patent No.: US 11,271,561 B2
(45) Date of Patent: Mar. 8, 2022

(54) THYRISTOR OR TRIAC CONTROL CIRCUIT

(71) Applicant: STMicroelectronics (Tours) SAS, Tours (FR)

(72) Inventors: Ghafour Benabdelaziz, Tours (FR); Cedric Reymond, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 16/879,561

(22) Filed: May 20, 2020

(65) Prior Publication Data

US 2020/0280310 A1 Sep. 3, 2020

Related U.S. Application Data

(63) Continuation of application No. 16/149,967, filed on Oct. 2, 2018, now Pat. No. 10,693,455.

(30) Foreign Application Priority Data

Oct. 16, 2017 (FR) ...................................... 1759683

(51) Int. Cl.
| | |
|---|---|
| *H03K 17/56* | (2006.01) |
| *H02M 7/06* | (2006.01) |
| *H02P 27/04* | (2016.01) |
| *H02M 5/257* | (2006.01) |
| *H03K 17/725* | (2006.01) |
| *H02M 1/08* | (2006.01) |
| *H02M 7/155* | (2006.01) |
| *H03K 17/722* | (2006.01) |
| *H03K 17/74* | (2006.01) |

(52) U.S. Cl.
CPC .............. *H03K 17/56* (2013.01); *H02M 1/08* (2013.01); *H02M 5/2573* (2013.01); *H02M 7/06* (2013.01); *H02M 7/1555* (2013.01); *H02P 27/04* (2013.01); *H03K 17/722* (2013.01); *H03K 17/725* (2013.01); *H03K 17/74* (2013.01)

(58) Field of Classification Search
CPC .......... H03K 17/56; H02M 1/08; H02M 5/06; H02M 7/06; H02P 27/04
See application file for complete search history.

(56) References Cited

U.S. PATENT DOCUMENTS

| | | |
|---|---|---|
| 3,470,436 A | 9/1969 | Steele |
| 3,742,295 A | 6/1973 | Irie |

(Continued)

FOREIGN PATENT DOCUMENTS

| | | |
|---|---|---|
| CN | 101976941 A | 2/2011 |
| CN | 101982934 A | 3/2011 |

(Continued)

*Primary Examiner* — Said Bouziane
(74) *Attorney, Agent, or Firm* — Seed IP Law Group LLP

(57) ABSTRACT

A thyristor or triac control circuit includes a first capacitive element that is series-connected with a first diode between a first terminal and a second terminal intended to be coupled to a gate of the thyristor or triac. A second capacitive element is coupled between the second terminal and a third terminal intended to be connected to a conduction terminal of the thyristor or triac on the gate side of the thyristor or triac. A second diode is coupled between the third terminal and a node of connection of the first capacitive element and first diode.

21 Claims, 4 Drawing Sheets

(56) References Cited

U.S. PATENT DOCUMENTS

| | | |
|---|---|---|
| 3,944,908 A | 3/1976 | Oki et al. |
| 4,400,755 A | 8/1983 | Lezan |
| 4,439,688 A | 3/1984 | Schornack |
| 4,658,199 A | 4/1987 | Hoffman |
| 4,811,189 A | 3/1989 | Harvest et al. |
| 4,878,010 A | 10/1989 | Weber |
| 5,013,993 A | 5/1991 | Bhagwat et al. |
| 5,287,263 A | 2/1994 | Shilo |
| 5,323,305 A | 6/1994 | Ikeda et al. |
| 5,388,022 A | 2/1995 | Ahuja |
| 5,796,599 A | 8/1998 | Raonic et al. |
| 5,822,203 A | 10/1998 | Peron |
| 5,831,349 A | 11/1998 | Weng |
| 6,018,473 A | 1/2000 | Claassen |
| 6,495,996 B1 | 12/2002 | Redlich |
| 6,728,320 B1 | 4/2004 | Khasnis et al. |
| 7,006,762 B2 | 2/2006 | Baskin et al. |
| 8,004,231 B2 | 8/2011 | Gonthier et al. |
| 8,779,749 B2 | 7/2014 | Heurtier et al. |
| 9,853,617 B2 | 2/2017 | Sautto et al. |
| 2003/0075990 A1 | 4/2003 | Guitton et al. |
| 2003/0146717 A1 | 8/2003 | Chiang |
| 2005/0082565 A1 | 4/2005 | Menard et al. |
| 2006/0039169 A1 | 2/2006 | Chen et al. |
| 2006/0120115 A1 | 6/2006 | Chen et al. |
| 2007/0052399 A1 | 3/2007 | Chen et al. |
| 2007/0052514 A1 | 3/2007 | Chen et al. |
| 2007/0153557 A1 | 7/2007 | Ochoa |
| 2007/0217237 A1 | 9/2007 | Salvestrini et al. |
| 2012/0026761 A1 | 2/2012 | Young |
| 2012/0120700 A1 | 5/2012 | Elberbaum et al. |
| 2012/0155138 A1 | 6/2012 | Gonthier et al. |
| 2018/0103520 A1 | 4/2018 | Zhu et al. |
| 2019/0222136 A1* | 7/2019 | Gonthier ............... H02M 7/062 |

FOREIGN PATENT DOCUMENTS

| | | |
|---|---|---|
| CN | 205283396 U | 6/2016 |
| CN | 205883178 U | 1/2017 |
| FR | 2038643 A5 | 1/1971 |
| FR | 2742013 A1 | 6/1997 |
| GB | 1310937 A | 3/1973 |
| JP | 2010125752 A | 6/2010 |
| JP | 4959008 B1 | 6/2012 |

* cited by examiner

THYRISTOR OR TRIAC CONTROL CIRCUIT

BACKGROUND

Technical Field

The present disclosure generally relates to electronic circuits and, more specifically, to a thyristor or triac control circuit.

Description of the Related Art

The control of a thyristor- or triac-type power switch requires extracting or injecting a current from or into the gate thereof. The generation of this current may require using a specific circuit to generate a current galvanically isolated from the upstream circuits which operate under a different voltage or with a different potential reference. This is particularly true in power applications when the switch controls an AC load or is connected to terminals of an AC voltage.

Current solutions are based on the use of opto-isolators or of galvanic isolation transformers.

BRIEF SUMMARY

An embodiment overcomes all or part of the disadvantages of known galvanically isolated control circuits.

An embodiment provides a solution avoiding the use of an isolation transformer or an opto-isolator.

An embodiment aims at a solution avoiding the use of an isolated power supply.

Thus, an embodiment provides a circuit for controlling a thyristor or a triac including:
- a first capacitive element, series-connected with a first diode, between a first terminal and a second terminal intended to be coupled to a gate of the thyristor or triac;
- a second capacitive element between the second terminal and a third terminal, intended to be connected to a conduction terminal of the thyristor or triac on the gate side; and
- a second diode between the third terminal and the node of connection of the first capacitive element and of the first diode.

According to an embodiment, a cathode of the first diode is on the side of the second terminal.

According to an embodiment, an anode of the second diode is on the side of the third terminal.

According to an embodiment, the circuit further includes a third capacitive element having a first electrode connected to the third terminal.

According to an embodiment, a resistive element is interposed between the second terminal and the gate of the thyristor or triac.

According to an embodiment, the first terminal is intended to receive a pulse train having an amplitude smaller than the amplitude of an AC voltage applied to the conduction terminals of the thyristor or triac, and at a frequency greater than the frequency of this AC voltage.

According to an embodiment, a second electrode of the third capacitive element is intended to be connected to a terminal of one of the potentials of the pulse train.

According to an embodiment, the first capacitive element is selected to withstand the AC voltage.

According to an embodiment, the third capacitive element is selected to withstand the AC voltage.

According to an embodiment, the thyristor is a cathode-gate thyristor.

An embodiment also provides a rectifier bridge including:
- at least one thyristor; and
- at least one control circuit.

An embodiment also provides an AC load control circuit including:
- at least one thyristor or triac; and
- at least one control circuit.

An embodiment also provides a circuit control method, wherein a pulse train having an amplitude smaller than the amplitude of an AC voltage applied to the conduction terminals of the thyristor or triac, and having a frequency greater than the frequency of this AC voltage, is applied to the first terminal.

According to an embodiment, the pulse train is supplied by a microcontroller.

According to an embodiment, the pulse train is supplied by an oscillator.

The foregoing and other features and advantages will be discussed in detail in the following non-limiting description of specific embodiments in connection with the accompanying drawings.

DETAILED DESCRIPTION

Figure 1:
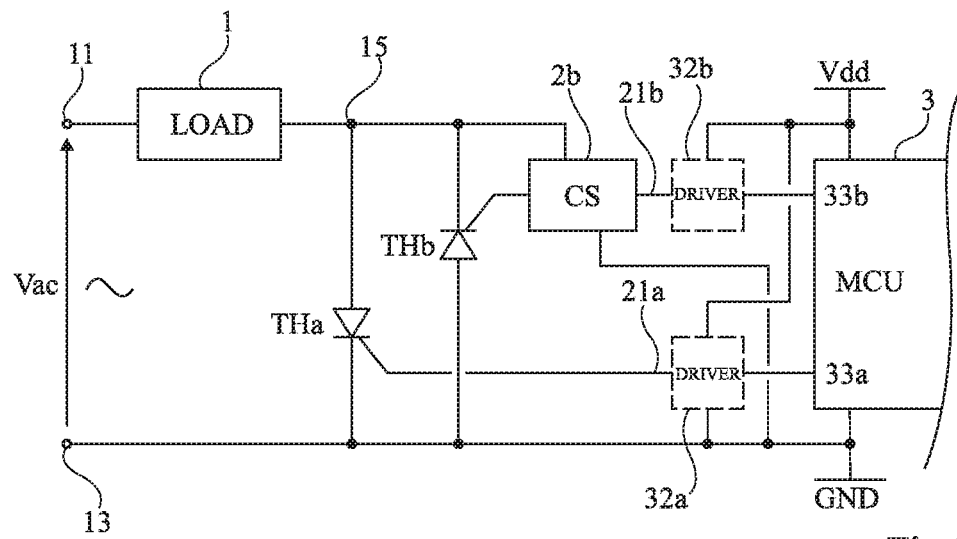
FIG. 1 is a simplified representation in the form of blocks of an embodiment of an AC load control circuit according to the present disclosure.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the embodiments which will be described have been shown and will be detailed. In particular, the final application of the switch has not been detailed, the described embodiments being compatible with usual applications of thyristors and triacs.

Unless otherwise specified, when reference is made to two elements connected together, this means directly connected with no intermediate element other than conductors, and when reference is made to two elements coupled together, this means that the two elements may be directly coupled (connected) or coupled via one or a plurality of other elements.

In the following description, expressions "approximately," "substantially," and "in the order of" mean to within 10%, preferably to within 5%.

FIG. 1 is a simplified representation in the form of blocks of an embodiment of an AC load control circuit according to the present disclosure.

The case of a load 1 (LOAD) supplied with an AC voltage Vac is assumed. Load 1 is series-connected with at least one thyristor between two terminals 11 and 13 of application of voltage Vac. In the shown example, the load is assumed to operate on the two halfwaves of voltage Vac.

The control circuit includes two thyristors THa and THb coupled, preferably connected, in parallel between a terminal 15 of load 1 and terminal 13, the other terminal of the load being connected to terminal 11. The anode of thyristor THa is on the side of terminal 15 and the anode of thyristor THb is on the side of terminal 13. Each thyristor here is a cathode-gate thyristor, meaning the gate of the thyristor is connected to the "cathode side" of the thyristor while the gate is connected to the "anode side" of the thyristor in an anode-gate thyristor, as will be understood by those skilled in the art.

For one of the thyristors to be turned on, a gate current has to be injected into it.

According to the embodiment described in FIG. 1, thyristor THa is controlled, preferably via an amplifier stage (DRIVER) 32a, here inverting, connected between the cathode and the gate of thyristor THa (control terminal 21a), based on a low-voltage signal referenced to a ground GND of a control circuit 3, generally digital, for example, a microcontroller MCU. An input of amplifier 32a is connected to an output terminal 33a of the microcontroller. Thyristor THb, the control signal of which cannot be directly referenced to ground, is associated with a circuit 2b (CS) forming a controllable isolated current source. Circuit 2b is connected between the cathode and the gate of thyristor THb. Circuit 2b is controllable from a low-voltage signal referenced to ground GND of control circuit 3. An amplifier stage (DRIVER) 32b, here inverting, may be interposed between an output terminal 33b of microcontroller 3 and a control terminal 21b of circuit 2b. As a variation, amplifier stages 32a, 32b, may correspond to an output stage of the microcontroller 3.

Microcontroller 3 is powered with a DC voltage Vdd (generally of a few volts), which is low with respect to the amplitude of the AC voltage (generally from several tens to several hundreds of volts). In the presence of amplifiers 32a and 32b, the latter are also powered with voltage Vdd.

It can already be seen that the control of thyristors THa and THb requires no isolated power supply. Indeed, circuit 2b is, on the side of voltage Vac, directly connected to the terminals (cathode and gate) of the thyristor THb that it controls. On the side of voltage Vdd, circuit 2b is directly connected to ground GND and is coupled by amplifier 32b to potential Vdd. Thyristor THa is directly controlled by amplifier 32a.

In certain embodiments, the two thyristors THa and THb may be replaced with a triac. A single current source or circuit 2 is then sufficient and the gate of the triac is on the side of the terminal (here, terminal 15) of voltage Vac directly connected to the triac.

Figure 2:
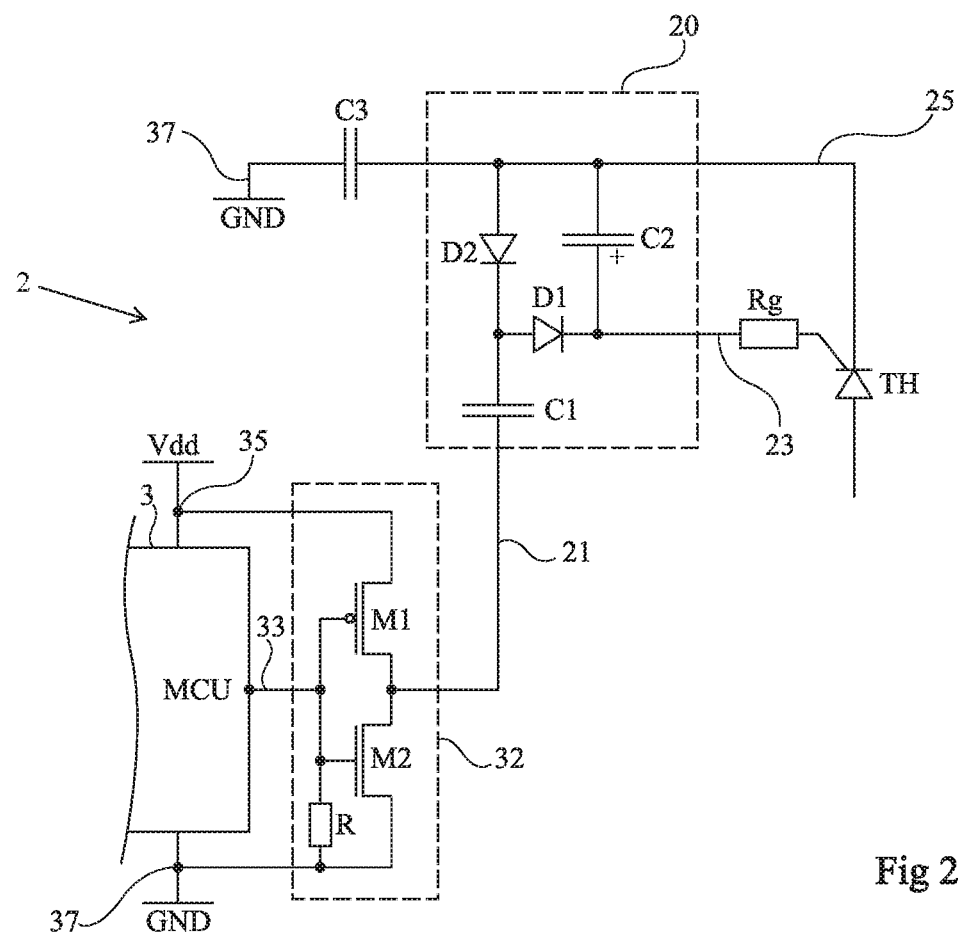
FIG. 2 schematically shows an embodiment of a thyristor or triac control circuit according to the present disclosure.

In FIG. 2, the elements which are identified by letters a and b in FIG. 1 are referenced without this letter when these elements are present in both thyristors.

According to the described embodiments, it is provided to generate the control current of thyristor TH by means of a current source based on capacitive elements, the dielectrics of the capacitive elements ensuring the isolation function.

FIG. 2 schematically shows an embodiment of a thyristor or triac control circuit 2.

The circuit 2 is intended to inject a gate current into a cathode gate thyristor TH.

The circuit 2 includes three terminals:
an input or control terminal 21 intended to receive a pulse control signal;
an output terminal 23, intended to be connected to the gate of the thyristor (or triac) that it controls; and
a reference terminal 25 intended to be connected to the cathode of thyristor TH (more generally, to the conduction electrode of the power switch located on the gate side).

The circuit 2 includes a first capacitive element C1 coupling, via a first diode D1, terminal 21 to terminal 23, the anode of diode D1 being on the side of capacitive element C1. Capacitive element C1 also couples, via a second diode D2, terminal 21 to terminal 25, the cathode of diode D2 also being on the side of capacitive element C1. A second capacitive element C2 couples the cathode of diode D1 and the anode of diode D2.

In the example of FIG. 2, terminal 25 is further connected, by a third capacitive element C3, to a terminal 37. The terminal 37 is coupled or connected to the reference potential, ground GND, of the power supply of circuit 3. In certain cases, a capacitor forming capacitive element C3 is already present in the application. If not, it is provided at the level of circuit 2. In the example of FIG. 2, a gate resistor Rg of thyristor TH takes part in the voltage-to-current conversion. An additional resistor may possibly connect the cathode of diode D1 to the gate of thyristor TH.

The capacitive element C1 is formed of a high-voltage capacitor (or of a plurality of high-voltage capacitors in parallel), that is, capable of withstanding a voltage between its terminals having the amplitude of the cathode-anode voltage of thyristor TH in the off state (typically, voltage Vac), or even more. Capacitor C1 has the function of providing the galvanic isolation between circuit 3, or amplifier 32, and the elements submitted to AC voltage Vac.

The capacitive element C3 is also formed of a high-voltage capacitor (or of a plurality of high-voltage capacitors in parallel), that is, capable of withstanding a voltage between its terminals having the amplitude of the cathode-anode voltage of thyristor TH in the off state (typically, voltage Vac), or even more. The function of capacitor C3 is to ensure a closing of the control current circulation loop, while ensuring the galvanic isolation between ground GND and AC voltage Vac.

The capacitive element C2 is formed of a low-voltage capacitor (or of a plurality of low-voltage capacitors in parallel), that is, capable of withstanding a voltage between its terminals lower than the cathode-anode voltage of thyristor Th in the off state (typically, voltage Vac), for example, of the order of magnitude of voltage Vdc. Capacitor C2 has the function of forming a voltage source.

In the example of FIG. 2, an amplifier 32 external to control circuit 3 is assumed. For example, the amplifier is formed of two MOS transistors, M1 and M2, series-connected between terminals 35 and 37 of application of voltage Vdd. The gates of transistors M1 and M2 are connected to terminal 33 of circuit 3. The junction point of transistors M1 and M2 is coupled to terminal 21. A resistor R of high value (at least some ten kilo-ohms) couples terminal 33 to ground (terminal 37) to discharge the gate capacitors of transistors M1 and M2 between pulses of the signal supplied by circuit 3.

The operating principle is to apply a pulse signal having a frequency greater (by a ratio of at least 10, preferably of at least 100) than the frequency of voltage Vac on terminal 21 to transfer power to capacitor C2 through capacitors C1 and C3. The power originates from the DC power supply of circuit 3, that is, from voltage Vdd, via amplifier 32. The injected current depends on the frequency of the pulse signal and on the values of capacitors C1 and C2.

Thus, assuming that thyristor TH is properly biased to be turned on, that is, that its anode-cathode voltage is positive, the supply of a digital pulse signal S33 by circuit 3 on its terminal 33 (for example, having an amplitude close to voltage Vdd, neglecting the on-state voltage drops in the switching elements of circuit 3), turns on the thyristor by injecting a gate current into it.

During falling edges of signal S33 (switching of the pulse signal from the high state (1 or Vdd) to the low state (0 or GND)), transistor M1 is turned on and transistor M2 turns off. This causes the flowing of a current from terminal 35 at potential Vdd, through transistor M1, capacitor C1, diode D1, on the one hand to inject a gate current into thyristor TH (current through the gate resistor Rg of thyristor TH, its cathode, which turns it on) and on the other hand to charge capacitor C2 (positive electrode+on the cathode side of diode D1). Diode D2 is non-conductive. The current loop is closed by capacitor C3.

During rising edges of signal S33 (switching of the pulse signal from the low state to the high state), transistor M2 is turned on and transistor M1 turns off. This causes the flowing of a current from positive electrode+of capacitor C2, through the gate of thyristor TH, its cathode (which turns it on), diode D2, and transistor M2. The current loop is closed by capacitor C3 (reverse current with respect to the direction during falling edges of signal S33).

Voltage Vdd should be greater than all the voltage drops during positive and negative edges.

At the starting of the circuit, voltage Vdd is used to progressively charge capacitor C2 before thyristors TH can turn on.

During periods when thyristor TH is reverse-biased (negative anode-cathode voltage), it is not disturbing for pulse signal S33 to keep on being supplied by circuit 3.

An advantage of the control circuit thus formed is that it requires neither transformer nor opto-isolator, including, as will more clearly appear from the following drawings, when two thyristors are used with different references for their respective cathodes. Indeed, the fact of referencing circuit 2 to the cathode of the thyristor that it controls avoids using a level-shifting circuit.

Figure 3:
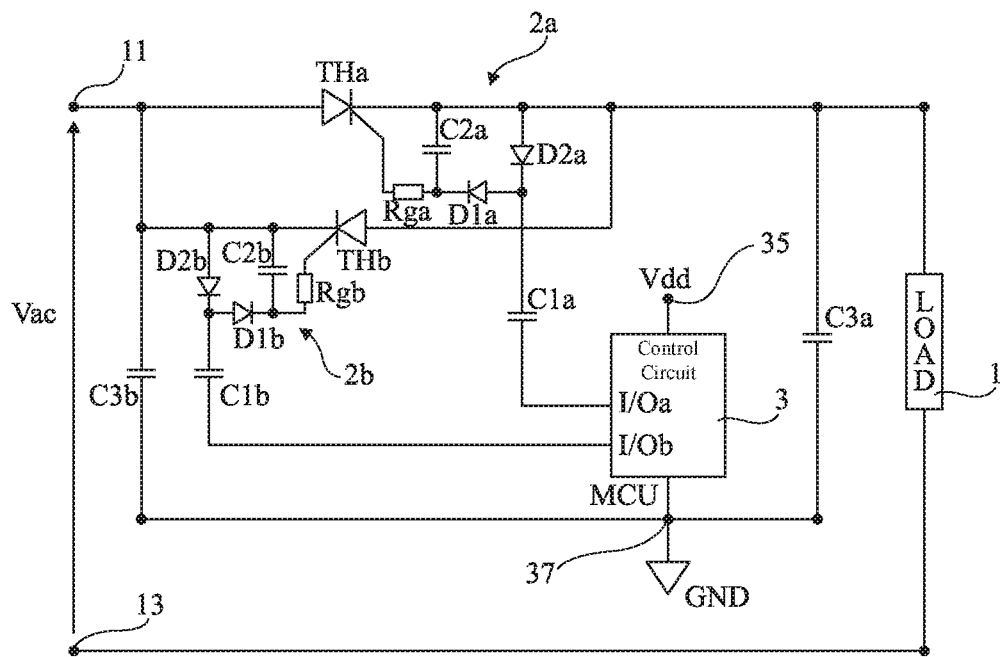
FIG. 3 is a more detailed diagram of the embodiment of FIG. 1.

FIG. 3 is an alternative embodiment of the load control circuit of FIG. 1, including circuits 2a and 2b.

It shows two thyristors THa and THb head to tail, series-connected with the load 1 (LOAD) that they control between two terminals 11 and 13 of application of an AC voltage Vac.

The control of thyristors THa and THb is provided by two circuits 2a and 2b of the type shown in FIG. 2. In the following description of FIG. 3, elements of circuits 2a and 2b are identified with the letters a and b, respectively, according to the circuit 2a, 2b to which they belong. When reference a or b is omitted, this means that circuit 2a or 2b and their respective components are indifferently concerned.

For each circuit 2, elements D1, D2, C1, C2, and C3 are connected as in FIG. 2 with respect to control circuit 3 and to the gate and cathode of the concerned thyristor.

The control circuit 3, for example, a microcontroller (MCU), powered with a DC low voltage Vdd between a terminal 35 and ground 37, includes two outputs I/Oa and I/Ob respectively connected to the electrode of capacitor C1a or C1b opposite to diodes D1 and D2 of the corresponding circuit 2. Each output I/O provides a digital pulse train, of high frequency with respect to the frequency of voltage Vac. Here, it is considered that amplifiers 32 (FIGS. 1 and 2) are integrated to the output stages of circuit 3 supplying the pulses.

Figure 4:
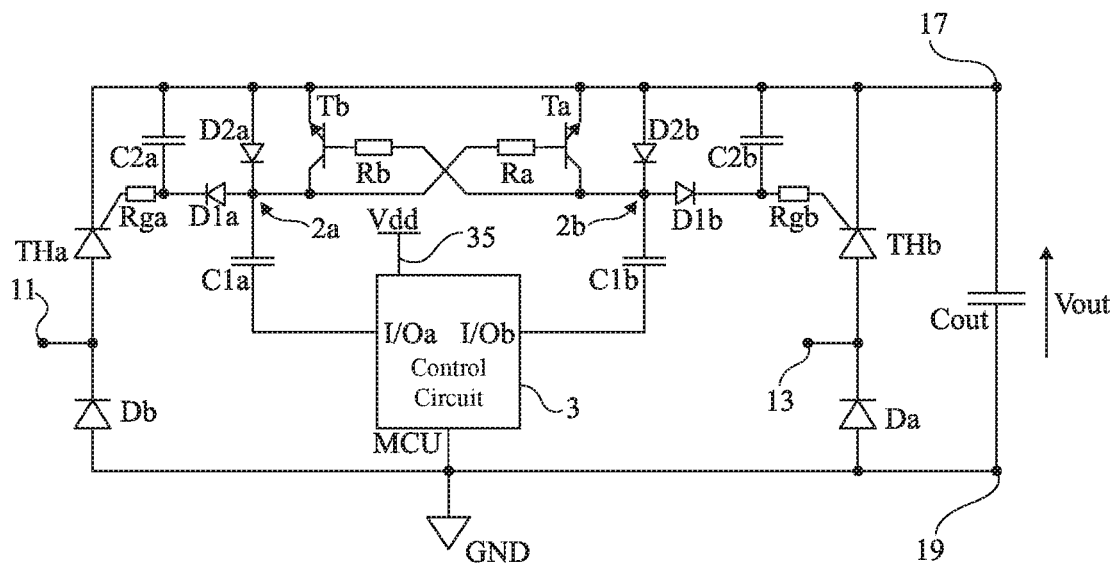
FIG. 4 illustrates the application of a circuit of the type described in relation with FIG. 2 in a mixed rectifier bridge according to one embodiment of the present disclosure.

FIG. 4 illustrates the application of a control circuit of the type described in relation with FIG. 2 in a mixed rectifier bridge.

Two input terminals 11 and 13 are intended to receive an AC voltage Vac. Two cathode-gate thyristors THa and THb are connected by their respective anodes to terminals 11 and 13 and by their respective cathodes to a first output terminal 17 of the bridge. Two diodes Da and Db are respectively connected by their cathodes to terminals 11 and 13 and by their anodes to a second output terminal 19 of the bridge. A capacitive element, for example, a capacitor Cout, couples output terminals 17 and 19, terminal 17 defining the positive terminal of DC voltage Vout supplied by the bridge and terminal 19 defining a reference potential (ground).

The operation of the power elements (thyristors THa, THb, diodes Da, Db) is usual. Thyristor THa is controlled to be on during positive halfwaves of voltage Vac while thyristor THb is controlled to be on during negative halfwaves of voltage Vac.

The control of thyristors THa and THb is provided by two circuits 2a and 2b of the type shown in FIG. 2. In the following description of FIG. 4, elements of circuits 2a and 2b are identified with letter a, respectively b, according to the circuit 2 to which they belong. When reference a or b is omitted, this means that circuit 2a or 2b and their respective components are indifferently concerned.

Each circuit 2a, 2b includes:
  a capacitor C1a and C1b, respectively;
  a capacitor C2a and C2b, respectively;
  a diode D1a and D1b, respectively, between its capacitors C1 and C2, with its anode being on the side of capacitor C1; and
  a diode D2a and D2b, respectively, between the anode of its diode D1 and the electrode of its capacitor C2 opposite to diode D1.

In the example of FIG. 4, the function of capacitor C3 of FIG. 2 is provided by capacitor Cout.

The control circuit 3, powered with a low DC voltage Vdd between a terminal 35 and ground 19, here includes two outputs I/Oa and I/Ob respectively connected to the electrode of capacitor C1a or C1b opposite to diodes D1 and D2 of the corresponding circuit 2. Each output I/O provides a digital pulse train, of high frequency with respect to the frequency of voltage Vac. It is considered that amplifiers 32 are integrated to the output stages of circuit 3 supplying the pulses.

The circuit 2a turns on thyristor THa during positive halfwaves of voltage Vac while circuit 2b turns on thyristor THb during negative halfwaves.

In the embodiment of FIG. 4, an assembly is further provided to deactivate the circuit 2 associated with a thyristor TH during halfwaves of voltage Vac when the other thyristor is on. This deactivates the corresponding circuit 2, independently from the signal supplied by circuit 3.

Each assembly includes a switch, for example, a bipolar transistor Ta, Tb, across diode D2b, D2a, respectively, of the other branch. Transistors Ta and Tb are for example NPN transistors. The base of each transistor T is connected, by a resistor R, to the collector of the transistor of the other branch. Thus, when thyristor THa is active and a gate current flows through its gate (and through its gate resistor Rga), part of the current flowing through capacitor C1a is injected through resistor Ra into the base of transistor Ta which turns on and short-circuits diode D2b. Symmetrically, when thyristor THb is active and a gate current flows through its gate (and through its gate resistor Rgb), part of the current flowing through capacitor C1b is injected through resistor Rb into the base of transistor Tb, which turns on and short-circuits diode D2a. Thus, it is ascertained that the thyristor THb, THa, respectively, which is not controlled by the pulse signal, is not controlled when under the effect of the charge of capacitor C1b, C1a, respectively, when the other thyristor THa, THb, respectively, is controlled.

Figure 5:
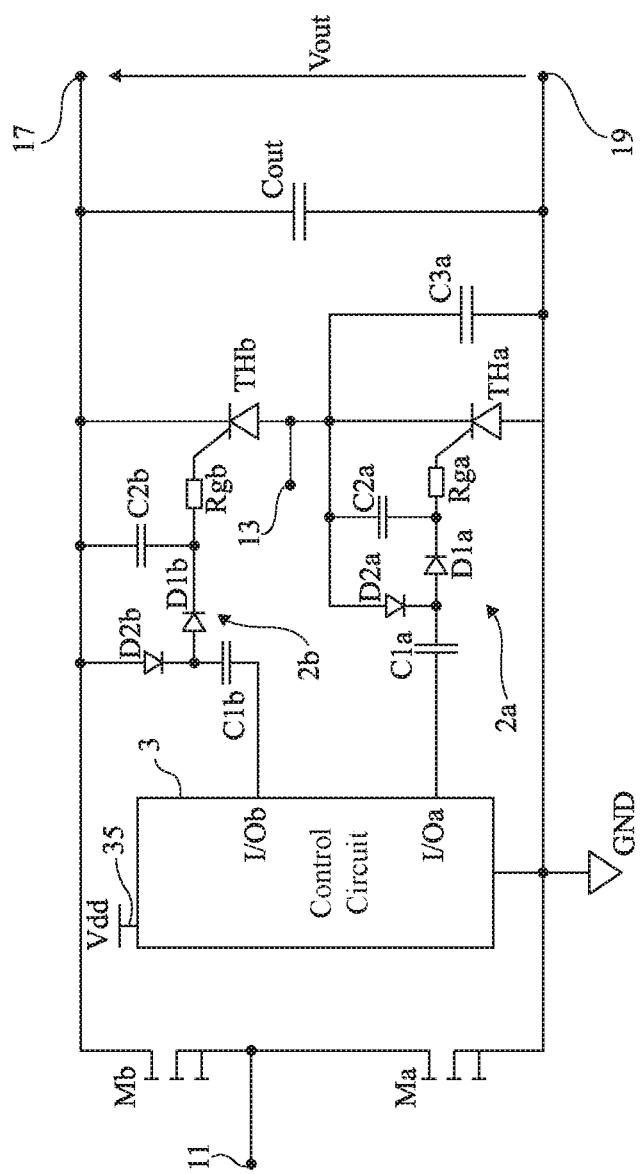
FIG. 5 shows an example of application of the circuit of FIG. 2 to a half-bridge rectifier circuit according to an embodiment of the present disclosure.

FIG. 5 shows an example of application to a half-bridge rectifier circuit.

Two MOS power transistors Ma and Mb are series-connected between two output terminals 17 and 19 for supplying an output voltage Vout, rectified and filtered by a capacitor Cout connecting terminals 17 and 19. Two cathode-gate thyristors THb and THa are also series-connected between terminals 17 and 19. The junction point of transistors Ma and Mb defines a first input terminal 11 of the bridge, intended for an AC voltage. The junction point of thyristors THb and THa defines a second input terminal 13 of the bridge intended for the AC voltage. The anode of thyristor THb and the cathode of thyristor THa are connected on the side of terminal 13.

The operation of the power switches (thyristors THa and THb, transistors Ma and Mb) is usual. Thyristor THa and transistor Ma are controlled to be on during positive half-waves of voltage Vac while thyristor THb and transistor Mb are controlled to be on during negative halfwaves of voltage Vac.

For its control, each thyristor THa, THb is associated with a circuit 2a, 2b, respectively. Here again, the elements of circuits 2a and 2b are identified by letter a, b, respectively, according to the circuit 2 to which they belong. When reference a or b is omitted, this means that circuit 2a or 2b and their respective components are indifferently concerned.

For each circuit 2, elements D1, D2, C1 and C2 are connected as in FIG. 2 or in FIG. 3 or 4 with respect to control circuit 3 and to the gate and cathode of the concerned thyristor. For circuit 2b, and thus thyristor THb, capacitor Cout plays the role of capacitor C3 of FIG. 2. For circuit 2a, and thus thyristor THa, a capacitor C3a connects terminal 13 (the cathode of thyristor THa) to ground 19.

The operation of circuits 2a and 2b can be deduced from the operation discussed in relation with the previous drawings.

Figure 6:
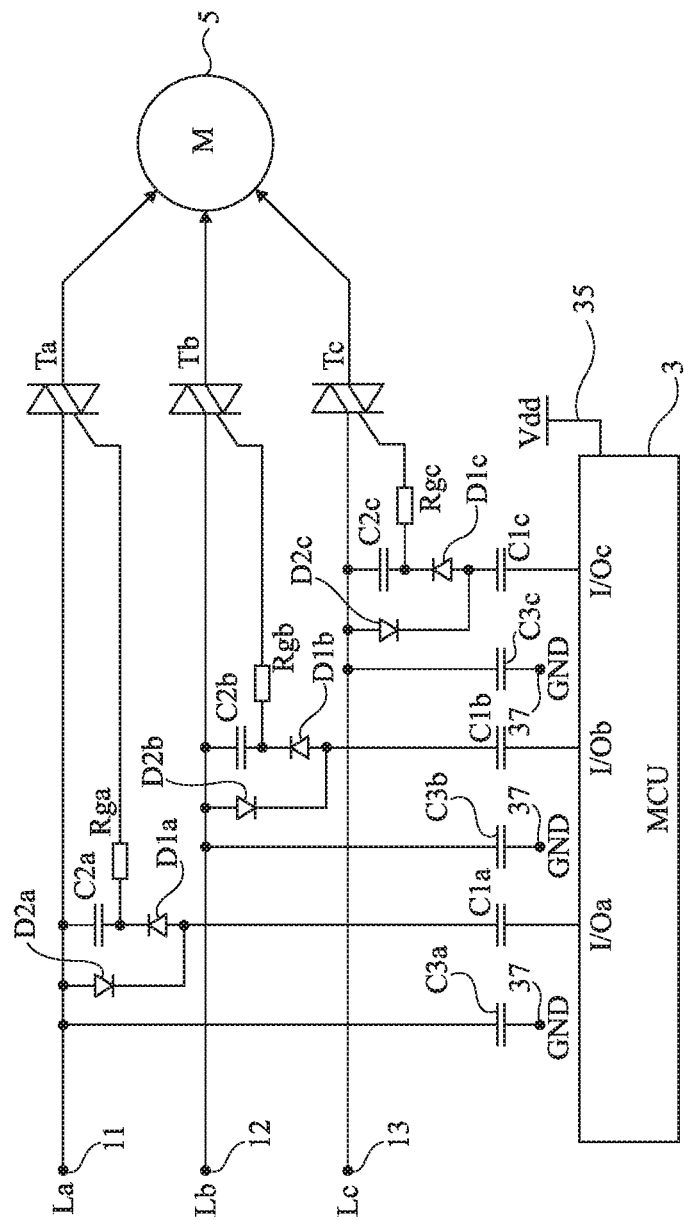
FIG. 6 shows another example of application of the circuit of FIG. 2 to the control of a three-phase motor according to an embodiment of the present disclosure.

FIG. 6 shows still another example of application to the control of a three-phase motor 5 (M).

Three triacs Ta, Tb, and Tc are respectively connected between three terminals 11, 12, 13 of application of the three phases La, Lb, and Lc of a three-phase AC voltage, and three winding terminals of motor 5. The gates of triacs Ta Tb, and Tc are respectively on the side of terminals 11, 12, and 13. Usually, the triacs are turned on two by two according to the phases of the AC voltage.

For its control, each triac Ta, Tb, Tc is associated with a circuit 2a, 2b, 2c. Here again, the elements of circuits 2a, 2b, and 2c are identified by letter a, b, or c, according to the circuit 2 to which they belong. When reference a, b, or c is omitted, this means that circuit 2a, 2b, or 2c and their respective components are indifferently concerned.

For each circuit 2, elements D1, D2, C1, and C2 are connected as in FIG. 2 with respect to control circuit 3, to outputs I/O, and to the gate and electrode on the side of terminal 11, 12, 13 having the concerned thyristors connected thereto. Here, a high-voltage capacitor C3, formed by respective capacitors C3a, C3b, C3c, connects terminal 11, 12, or 13 to the ground 37 of power supply voltage Vdd of circuit 3.

The operation of circuits 2 can be deduced from the operation discussed in relation with the previous drawings.

An advantage of the described embodiments is that they are compatible with a direct control from a microcontroller-type circuit without requiring an opto-isolator or an isolation transformer.

Another advantage is that the forming of the circuits forming the current sources is particularly simple.

Reference has been made to embodiments based on cathode-gate thyristors. However, all that is described also applies to anode-gate thyristors, the difference being that a gate current has to be extracted instead of being injected. It is thus sufficient to reverse the biasing of diodes D1 and D2.

Further, the control signal of the control circuit may be supplied by an oscillator, preferably having a rectangular or square signal, instead of being supplied by a microcontroller.

Various embodiments have been described. Various modifications will readily occur to those skilled in the art. In particular, the choice between thyristors and triac depends on the application and the implementation of the described embodiments is compatible with usual choices on this respect. Further, the practical implementation of the described embodiments is within the abilities of those skilled in the art based on the functional indications given hereabove and by using electronic components usual per se.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A device, comprising:
a control circuit having a first terminal and a second terminal;
an output terminal;
a first thyristor with a first gate;
a second thyristor with a second gate;
a first switch coupled between the first terminal of the control circuit and the output terminal;
a second switch coupled between the second terminal of the control circuit and the output terminal;
a first resistor coupled between a first gate of the first switch and the second terminal of the control circuit;
a second resistor coupled between a second gate of the second switch and the first terminal of the control circuit;

a first diode coupled between the output terminal and the first terminal of the control circuit;
a second diode coupled between the first terminal of the control circuit and the first gate of the first thyristor;
a third diode coupled between the output terminal and the second terminal of the control circuit; and
a fourth diode coupled between the second terminal of the control circuit and the second gate of the second thyristor.

2. The device of claim 1, further comprising:
a first capacitor coupled between the control circuit and the first diode; and
a second capacitor coupled between the control circuit and the third diode.

3. The device of claim 2, further comprising:
a third capacitor coupled between the output terminal and the second diode; and
a fourth capacitor coupled between the output terminal and the fourth diode.

4. The device of claim 3, further comprising a fifth capacitor coupled between the output terminal and ground.

5. The device of claim 3, further comprising:
a fifth diode coupled between the first gate of the first thyristor and ground; and
a sixth diode coupled between the second gate of the second thyristor and ground.

6. The device of claim 5, wherein the first resistor is coupled between a gate of the first switch and a source/drain of the second switch and the second resistor is coupled between a gate of the second switch and a source/drain of the first switch.

7. The device of claim 5, further comprising:
a third resistor coupled between the second diode and the first thyristor; and
a fourth resistor coupled between the fourth diode and the second thyristor.

8. A device, comprising:
a control circuit having a first I/O terminal and a second I/O terminal;
a first output terminal;
a second output terminal;
a third terminal;
a first thyristor coupled between the third terminal and the first output terminal;
a second thyristor coupled between the third terminal and the second output terminal;
a first capacitor coupled to the first I/O terminal of the control circuit;
a first diode coupled between the first capacitor and the third terminal;
a second diode coupled between the first capacitor and the first thyristor;
a second capacitor coupled between the third terminal and the first thyristor;
a third capacitor coupled to the second I/O terminal of the control circuit;
a third diode coupled between the third capacitor and the second thyristor;
a fourth diode coupled between the third capacitor and the second output terminal; and
a fourth capacitor coupled between the second output terminal and the second thyristor.

9. The device of claim 8, further comprising a fifth capacitor coupled between the first output terminal and the second output terminal.

10. The device of claim 9, further comprising:
a first resistor coupled between the second capacitor and the first thyristor; and
a second resistor coupled between the fourth capacitor and the second thyristor.

11. The device of claim 8, further comprising:
a first switch coupled between the first terminal of the control circuit and the first output terminal; and
a second switch coupled between the second terminal of the control circuit and the first output terminal.

12. A device, comprising:
a control circuit;
a first thyristor having a first gate;
a second thyristor having a second gate;
a first input terminal coupled to the first thyristor;
a second input terminal coupled to the second thyristor;
a first capacitor coupled between the first input terminal and the first gate of the first thyristor;
a first diode coupled between the first capacitor and a first I/O terminal of the control circuit;
a second diode coupled between the first I/O terminal of the control circuit and the first input terminal;
a second capacitor coupled between the second input terminal and the second gate of the second thyristor;
a third diode coupled between the second capacitor and a second I/O terminal of the control circuit; and
a fourth diode coupled between the second I/O terminal of the control circuit and the second input terminal.

13. The device of claim 12, further comprising:
a third input terminal;
a third thyristor coupled to the third input terminal, the third thyristor having a third gate;
a three-phase motor coupled to the first thyristor, the second thyristor, and the third thyristor;
a third capacitor coupled between the third input terminal and the third gate of the third thyristor;
a fifth diode coupled between the third capacitor and a third I/O terminal of the control circuit; and
a sixth diode coupled between the fifth diode and the third input terminal.

14. The device of claim 13, further comprising:
a fourth capacitor coupled between the first input terminal and ground;
a fifth capacitor coupled between the second input terminal and ground; and
a sixth capacitor coupled between the third input terminal and ground.

15. The device of claim 14, further comprising:
a first resistor coupled between the first capacitor and the first gate of the first thyristor;
a second resistor coupled between the second capacitor and the second gate of the second thyristor; and
a third resistor coupled between the third capacitor and the third gate of the third thyristor.

16. The device of claim 15, further comprising:
a seventh capacitor coupled between the first I/O terminal of the control circuit and the second diode;
an eighth capacitor coupled between the second I/O terminal of the control circuit and the fourth diode; and
a ninth capacitor coupled between the third I/O terminal of the control circuit and the sixth diode.

17. The device of claim 13 wherein the first, second, and third thyristors are bilateral triode thyristors.

18. The device of claim 17 wherein:
a first terminal of the first thyristor is coupled to the first input terminal; and a second terminal of the first thyristor is coupled to the three-phase motor.

19. The device of claim 18 wherein:

a first terminal of the second thyristor is coupled to the second input terminal;

a second terminal of the second thyristor is coupled to the three-phase motor;

a first terminal of the third thyristor is coupled to the third input terminal; and a second terminal of the third thyristor is coupled to the three-phase motor.

20. A device, comprising:

a control circuit;

an output terminal;

a first thyristor;

a second thyristor;

a first switch coupled between the control circuit and the output terminal;

a second switch coupled between the control circuit and the output terminal;

a first resistor coupled between the first switch and the second switch;

a second resistor coupled between the first switch and the second switch;

a first diode coupled between the output terminal and the control circuit;

a second diode coupled between the control circuit and the first thyristor;

a third diode coupled between the output terminal and the control circuit;

a fourth diode coupled between the control circuit and the second thyristor;

a first capacitor coupled between the control circuit and the first diode;

a second capacitor coupled between the control circuit and the third diode;

a third capacitor coupled between the output terminal and the second diode; and a fourth capacitor coupled between the output terminal and the fourth diode.

21. The device of claim 20, further comprising a fifth capacitor coupled between the output terminal and ground.

\* \* \* \* \*